United States Patent
Lombardo et al.

(10) Patent No.: US 6,772,992 B1
(45) Date of Patent: Aug. 10, 2004

(54) MEMORY CELL STRUCTURE INTEGRATED ON SEMICONDUCTOR

(75) Inventors: Salvatore Lombardo, Catania (IT); Cosimo Gerardi, Brindisi (IT); Isodiana Crupi, Crotone (IT); Massimo Melanotte, Milan (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/701,768

(22) PCT Filed: Aug. 31, 2000

(86) PCT No.: PCT/EP00/08529
§ 371 (c)(1),
(2), (4) Date: May 22, 2001

(87) PCT Pub. No.: WO01/56087
PCT Pub. Date: Aug. 2, 2001

(30) Foreign Application Priority Data

Jan. 28, 2000 (EP) .............................................. 00830060

(51) Int. Cl.[7] ............................................ H01L 29/788
(52) U.S. Cl. .......................... 251/315; 251/318; 251/66; 251/71
(58) Field of Search ................................ 257/315–318, 257/66–71; 438/201, 211, 257, 296

(56) References Cited

U.S. PATENT DOCUMENTS 4,958,321 A  *  9/1990  Chang ......................... 365/158
5,488,243 A  *  1/1996  Tsuruta et al. ............... 257/314
5,830,575 A     11/1998  Warren et al. ............... 428/404

FOREIGN PATENT DOCUMENTS

EP    505790    9/1992
FR   2772989    6/1999

OTHER PUBLICATIONS

D.J. DiMaria et al., "Electronically–alterable read–only–memory using Si–rich $SiO_2$ injectors and a floating polycrystalline silicon storage layer," *Journal of Applied Physics,* 7(52):4825–4842, Jul. 1, 1981.

Abstract of FR 2772989, Jun. 25, 1999, *esp@cenet* database.

* cited by examiner

*Primary Examiner*—Carl Whitehead, Jr.
*Assistant Examiner*—Yennhu B. Huynh
(74) *Attorney, Agent, or Firm*—Lisa K. Jorgenson; Timothy L. Boller; Seed IP Law Group PLLC

(57) ABSTRACT

This invention relates to a memory cell which comprises a capacitor having a first electrode and a second electrode separated by a dielectric layer. Such dielectric layer comprises a layer of a semi-insulating material which is fully enveloped by an insulating material and in which an electric charge is permanently present or trapped therein. Such electric charge accumulated close to the first or to the second electrode, depending on the electric field between the electrodes, thereby defining different logic levels.

22 Claims, 3 Drawing Sheets

MEMORY CELL STRUCTURE INTEGRATED ON SEMICONDUCTOR

FIELD OF THE INVENTION

This invention relates to a memory cell structure integrated on a semiconductor, usable for either a volatile memory, such as a DRAM (Dynamic Random Access Memory) or a non-volatile memory, such as an EPROM, EEPROM (Electrically Erasable Programmable Read-Only Memory), or Flash EEPROM.

More particularly, the present invention relates to a memory cell of the type which comprises a capacitor having the first electrode and the second electrode separated by a dielectric layer. The invention further relates to a method of storing information into a memory cell which comprises a capacitor having the first electrode and the second electrode separated by a dielectric layer.

PRIOR ART

As it is known, the manufacture of semiconductor-integrated electronic memory devices is concerned with both volatile and non-volatile memories. The structures of non-volatile memory cells, such as cells of the EPROM, EEPROM and Flash EEPROM type, as well as the one of volatile memory cells, such as cells of the RAM and DRAM type, has been known for a long time. As an example, it is reminded that non-volatile EEPROMs require no refresh pulses, as do instead the charge-storing capacitive elements of the conventional volatile memory cells such as DRAMs.

In literature several methods of manufacturing EEPROMs are known, see for example the U.S. Pat. No. 3,649,884 (granted on Mar. 14, 1972 to Haneta and assigned to NEC) and the U.S. Pat. No. 4,870,470 (granted on Sep. 26, 1989 to Bass et al. and assigned to IBM).

The former of these documents discloses a field-effect transistor with a gate which includes a layer of Silicon-Rich Oxide (SRO) and in which it is injected a charge obtained from a silicon substrate, through a stoichiometric silicon oxide layer.

The latter document discloses a non-conductive structure wherein the charge is trapped and which is based on an injection of hot carriers from the control gate. More particularly, in this document it is described a cell structure which is formed as a stack comprising a layer of silicon-rich silicon nitride which serves as a floating gate; a dielectric layer acting as a barrier; and a second layer of silicon-rich silicon nitride which serves as a control gate.

The cell operation is based on a charge trapping injection mechanism. The silicon content of the two silicon-rich silicon nitride layers is controlled so that the first layer provides with an appreciable charge storage, but not with a significant charge conduction, and the second layer provides with an appreciable charge conductance, but not with a significant chargestorage. Thus, the charge is injected from the control gate into the floating gate and becomes trapped in the latter.

However, these memory cells have considerable disadvantages, foremost among which is the possible damage of the tunnel oxide each time that information is stored into the cell. Furthermore, the operating speed is drastically limited. Because of these reasons, EEPROMs cannot be used as the main memory of a computer.

On the other hand, non-volatile memory cells, such as DRAMs, are much faster and more compact. In currently manufactured DRAMs the elementary cell typically consists of a MOS (Metal Oxide Semiconductor) capacitor in series with a MOSFET (Metal Oxide Semiconductor Field-Effect Transistor) transistor used to select the cell. The information stored in the cell is the state of the MOS capacitor, which can be either in a depleted condition corresponding to a high logic level "UP" or in a opposite condition, corresponding to a low logic level "DOWN". Since the fully depleted condition is metastable, the logic level "UP" tends to decline into the logic level "DOWN", and this is an effect mainly due to a leakage current of the selection MOSFET. To prevent this decline from the level "UP" to the level "DOWN", the information stored in the MOS capacitor is periodically "refreshed" with a regular frequency, which is on the order of a few kHz in present DRAM technology.

With an ever greater circuit density, the number of cells integrated on a single DRAM chip has increased, and the size of the individual capacitors decreased. This makes retaining a sufficient charge within the capacitor to provide an acceptable signal/noise ratio rather difficult. In addition, because of leakage currents, these volatile memory cells require ever more frequent refresh cycles to maintain their charge level, also following to the fact that their content gets lost as soon as the supply voltage is switched off or disconnected.

Thus, in the electronic industry there is the need to look for new methods of increasing storage capacity and refresh time, that is to form non-volatile DRAMs. An attempt has been made in this direction in the European Patent Application No. EP 0,557,581, proposing a single-transistor DRAM cell which comprises a tunnel oxide or a dual electron injector structure disposed between a charge build-up point and the floating gate in order to maintain the information also during the voltage interruptions.

However, the structure described in the above document is an expanded one and, accordingly, lacks scalability from the planar standpoint.

The new technical problem that underlies this invention is to contrive a memory cell structure for implementing volatile and non-volatile memory devices, which are scalable from the planar standpoint and fast at low costs, as well as a new method of storing information into the memory cell.

SUMMARY OF THE INVENTION

The resolution idea on which the present invention is based, is that of providing a cell structure, which allows to store information, by trapping the charge permanently within a semi-insulating material, and by shifting such charge reversibly between two different spatial positions corresponding to two logic levels "UP" and "DOWN". The low mobility of the charge within the semi-insulating material guarantees a very long refresh time.

Based on such resolutive idea, the technical problem is solved by a memory cell of the type previously indicated and defined by the characterising portion of the enclosed claim 1.

The features and advantages of the memory cell according to the invention will be apparent from the following description of an embodiment thereof, given by way of non-limitative example with reference to the accompanying drawings.

DETAILED DESCRIPTION

The process steps and the hereafter described structures don't form a complete process flow for the fabrication of integrated circuits. In fact, this invention can be practised along with techniques of fabricating integrated circuits currently used in the industry, and only such commonly used conventional process steps which are necessary to make the invention understandable will be described.

The figures showing cross-sectional portions of an integrated circuit during its fabrication are not drawn to scale, but they are indeed drawn to highlight the major features of the invention.

Figure 1:
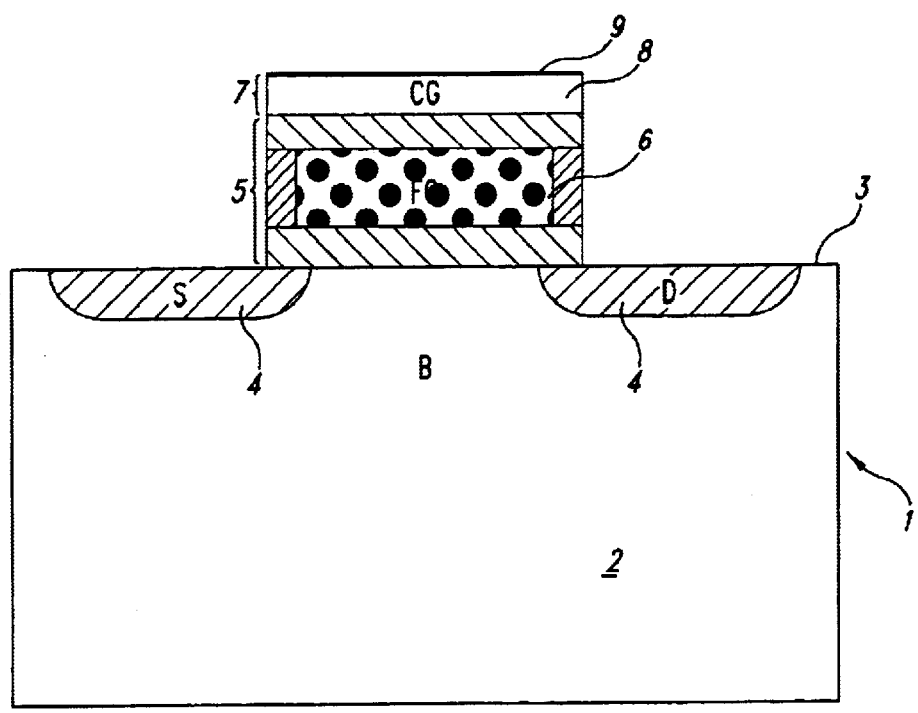
FIG. 1 shows a schematic, enlarged and cross-sectional view of a memory cell according to the invention.

Referring to such figures, and in particular to the example of FIG. 1, a substrate 2 of monocrystalline silicon, e.g. of the p type, is schematically shown at 1 as having an upper surface 3 and comprising two doped regions 4, e.g. of the n-type dopant, which are placed close to the surface 3 and are separated from each other. These regions 4 represent the source/drain regions of a transistor which forms the bearing structure of the cell 1 in this embodiment.

Located above the surface 3 and between the two regions 4 is a silicon oxide cage 5 of sort which envelopes a film 6 of an electric charge storing material, such as a SRO layer, which acts as floating gate of the transistor. Such SRO layer can be converted—at high processing temperatures and if contains an oxygen concentration between 20% and 50%—into a composite material formed of crystalline silicon grains fully embedded in the silicon oxide.

On top of the cage 5 a control electrode or control gate 7 is formed; this comprises a layer 8 of n+ polycrystalline silicon and a thin metallic layer 9 of tungsten silicide.

Advantageously, the memory cell is thus provided with a capacitor having a first electrode and a second electrode separated by a dielectric layer, which includes a layer of a semi-insulating material completely enveloped by insulating material and in which an electric charge is present or trapped permanently; this electric charge can be built up near the first electrode or the second electrode, depending on the electric field between the electrodes, so that different logic levels are defined.

Figure 2:
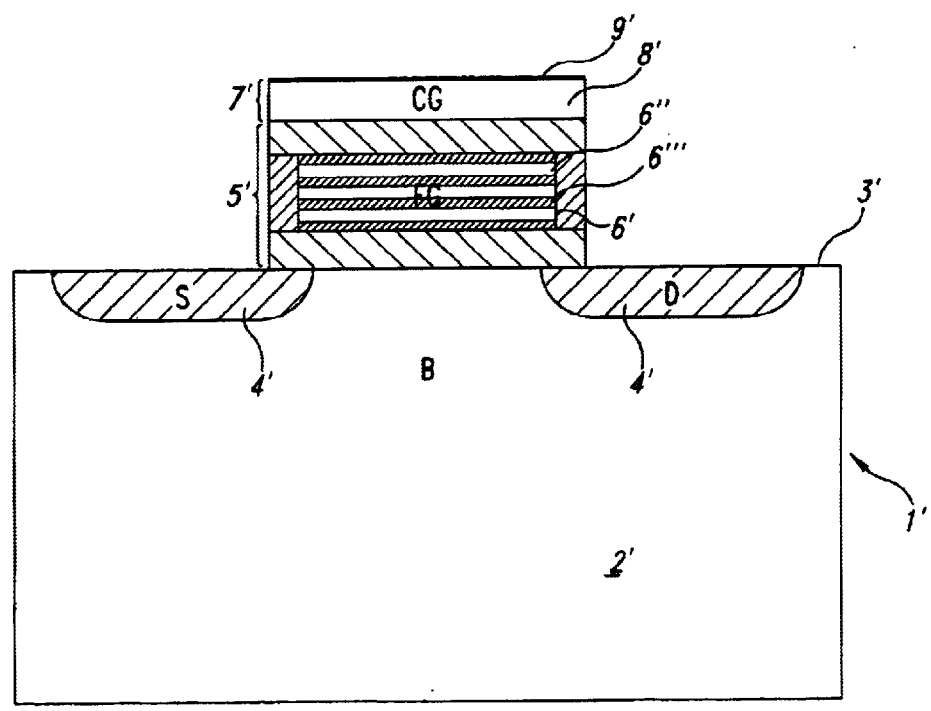
FIG. 2 shows a schematic, enlarged and cross-sectional view of a modified embodiment of the memory cell according to the invention.

Shown in FIG. 2 is a second embodiment of a single-transistor memory cell, with the reference 1' indicating schematically a substrate 2' of monocrystalline silicon, e.g. of the p type, which has an upper surface 3' and comprises two doped regions 4', e.g. of the n type, extending adjacent to the surface 3' and being separated from each other. A cage 5' of silicon oxide is placed on top of the surface 3', and between the two regions 4', such cage 5' comprising a multi-stack 6' of ultra-thin silicon films 6" and silicon oxide 6'" acting as a floating gate. The control electrode or control gate 7' is placed on top of the cage 5' and comprises a polycrystalline silicon layer 8' of the n+ type and a thin metallic layer 9' of tungsten silicide.

As mentioned above, the structure comprising the insulating cage with the semi-insulating material can be used as gate region of a MOSFET transistor so that, if a permanent charge is stored in the semi-insulating layer, the threshold voltage of the FET depends on the position of such charge within the semi-insulating material, i.e. on the fact that said charge can be close either to the gate metallic layer or the silicon substrate.

This mechanism yields a memory cell having a single transistor and two logic levels. In this cell, the information refreshing time will depend on the motion of the charge within the semi-insulating layer. The charge motion is determined by parameters such as the ratio of the amount of oxygen to the amount of silicon, for the SRO, or by the thickness of the ultra-thin silicon layers of the silicon oxide stack in the case of the plurality of layers laid one on top of the others. By adjusting these parameters, a very long refresh time, on the order of seconds, can be obtained.

On the bases of the two embodiments shown in FIGS. 1 and 2, a permanent charge can be stored in the floating gate and shifted through the semi-insulating layer. The initial introduction of the charge can be obtained, for example, by biasing the substrate and the control gate with an elevated voltage.

Figure 3A:
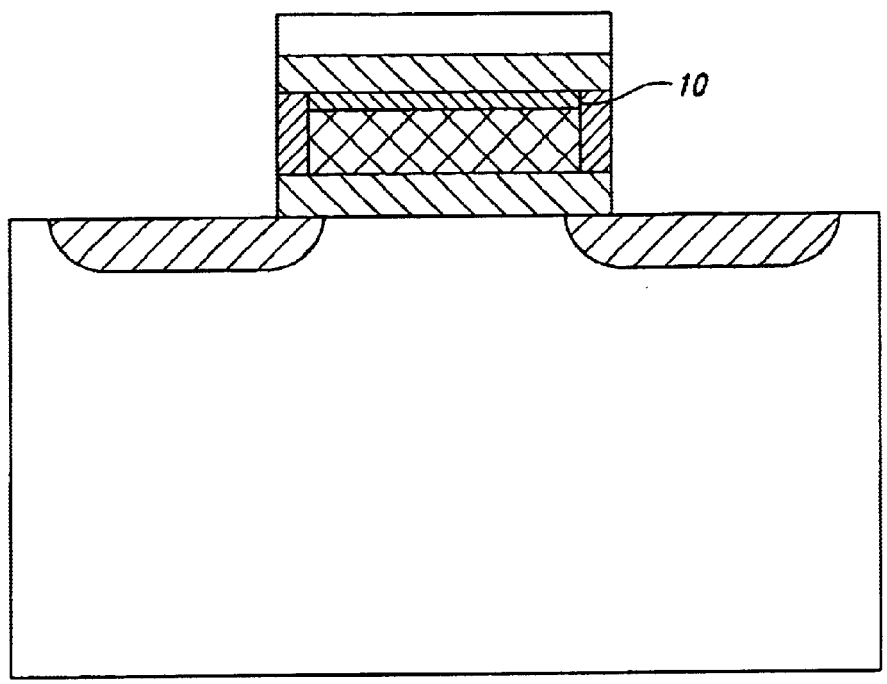
FIG. 3a shows a schematic, enlarged and cross-sectional view of a memory cell according to the invention in a first condition of its operation.
Figure 3B:
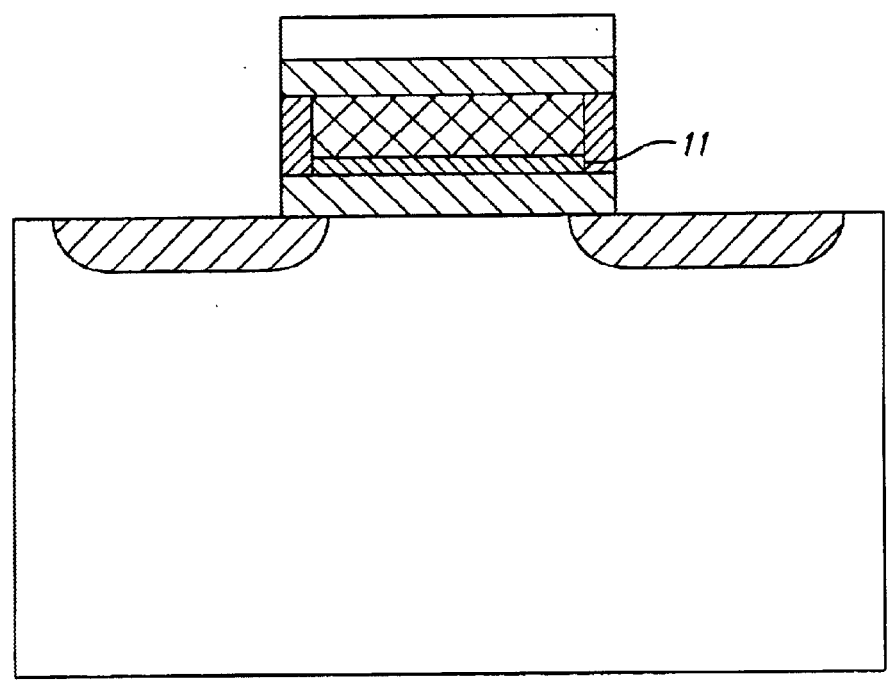
FIG. 3b shows a schematic, enlarged and cross-sectional view of a memory cell according to the invention in a second condition of its operation.

Thereafter, for writing, reading and refreshing operations, the potential is hold at lower levels in order to have the charge permanently retained within each floating gate of the memory array. FIG. 3 shows an embodiment wherein the stored charge is reversibly shifted from the region 10 of the floating gate, adjacent to the control gate (FIG. 3A), to the floating gate region 11 adjacent to the substrate (FIG. 3B).

The two different spatial positions of the charge within the floating gate correspond respectively to two logic levels, "UP" and "DOWN", of the memory cell. If the carrier transfer in the floating gate is slow, the information can be updated in the cell with an extremely low frequency. The conduction through the SRO is instead controlled by the thermionic emission field between crystalline silicon grains included in the silicon oxide. When an electric field of strength E is applied, at room temperature and higher temperatures, the current density J is given by:

$$J = A^* f_p f_Q T^2 \exp(-E_B/k_B T)\exp(+qER/k_B T) \qquad (1)$$

where, $A^*$ is Richardson-Fermi constant;

$f_p$ is the probability of the phonon carrier scattering through the barrier region;

$f_Q$ is the probability of tunneling occurring between grains through the oxide;

$E_B$ is the potential energy of the barrier as seen by the carrier, $k_B$ being Boltzmann's constant;

T is the absolute temperature, q being the elementary charge and R the mean radius of the crystalline silicon grain.

Based on these hypotheses, with typical values of the parameters in Eq. (1), a refresh time on the order of a few seconds is to be expected at an electric field of a few MV/cm. Thus, in a memory of this type, the refresh time can be some orders longer than the one of conventional DRAMs.

Figure 4:
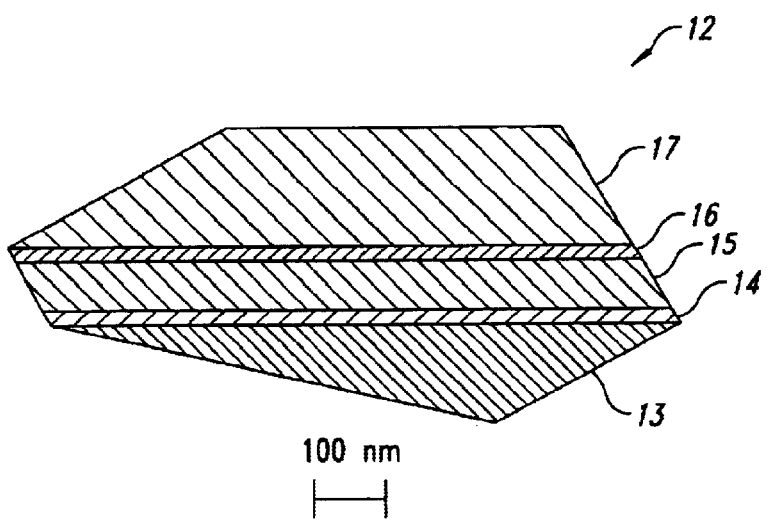
FIG. 4 shows a TEM (Transmission Electron Microscopy) picture of a MOS capacitor made experimentally according to the invention teachings and comprising the silicon substrate, a first thin layer of silicon oxide, a SRO film, a second thin layer of silicon oxide, and a control gate of n+ polysilicon.

With the above described method, a MOS capacitor with an insulator containing a thin SRO film can be formed. FIG. 4 shows a TEM (Transmission Electron Microscopy) vertical-sectional picture of a MOS capacitor 12, formed according to the first embodiment, comprising a silicon substrate 13, a thin layer 14 of silicon oxide, a SRO film 15, a second thin layer 16 of silicon oxide, and a gate 17 of n+ polycrystalline silicon.

Figure 5:
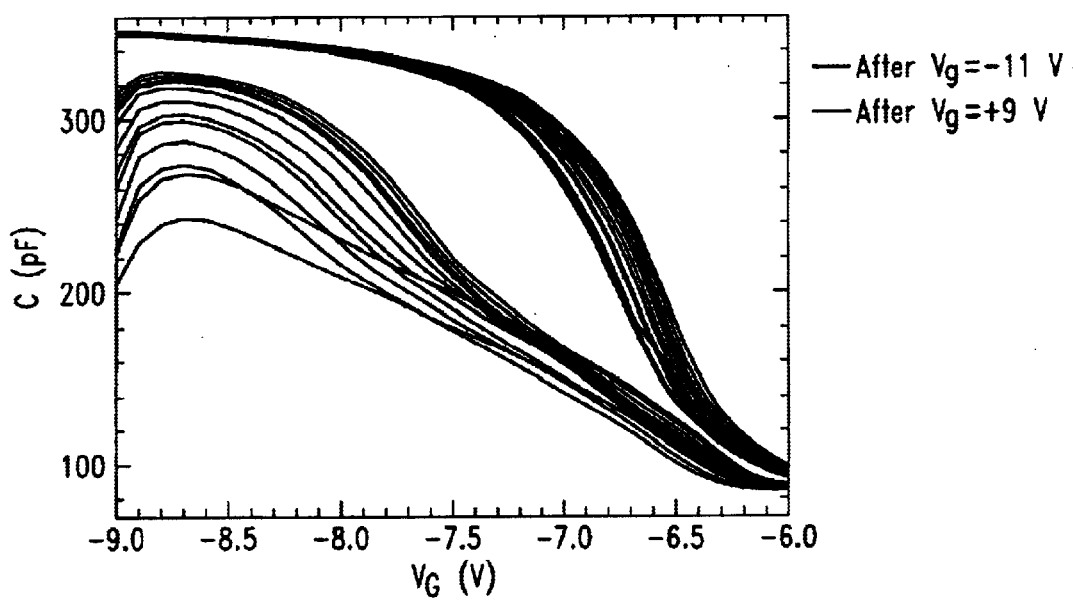
FIG. 5 shows the results of measurements taken on the MOS capacitor of FIG. 4, illustrating the motion of the holes going through the SRO film from a level "UP" to a level "DOWN", and vice versa. In this case, such reversible motion is repeated 20 times.

During the initial step this device can be written with holes by applying a voltage of 25V to the control gate. FIG. 5 shows the course state of capacitance vs. voltage (C–V) of the experimental measurements made on the MOS capacitor of FIG. 4, showing the motion of the holes through the SRO film from the logic level "UP" to the logic level "DOWN", and vice versa. The motion is produced by applying voltages of alternatively −11V and +9V to the control gate. The reversible motion is repeated 20 times in FIG. 5 and can explain the distorted curves C–V that were measured after having applied a write voltage of +9V.

In view of the scan duration for the curves C–V being of about 1 minute, the motion of the holes through the SRO layer requires times on the order of minutes. Accordingly, a refresh time on the order of a minute is contemplated for a structure as the one shown in FIG. 4.

The above described memory cell has several advantages. In fact, by virtue of the long refresh time, the cell can be used in low-power devices. Furthermore, unlike EEPROMs, the cell tunnel oxide is not stressed at each write/erase cycle by the vertical beam of electrons which is injected from the silicon substrate into the floating gate, and vice versa. Such a stress greatly deteriorates the tunnel oxide and reduces the maximum number of write/erase cycles allowed in an EEPROM before the device ceases to operate.

In the inventive structure, the tunnel oxide is instead stressed only during the pre-writing operation, that is carried out only once in the cell lifetime. In addition, SRO is known to be less likely to undergo stress mechanisms than silicon oxide. Also, the single-transistor structure implies a reduction in the cell sizes, which can be used for a large scale integration. Finally, the fabrication process of the proposed cell has been made simpler than that of the DRAMs, since it does not involve steps of forming the MOS capacitor.

What is claimed is:

1. A memory cell of the type which comprises a capacitor having a first electrode and a second electrode separated by a dielectric layer, characterized in that said dielectric layer comprises a layer of a semi-insulating material which is fully enveloped by insulating material and in which an electric charge is permanently present or trapped, said electric charge being accumulated close to the first or to the second electrode, depending on the electric field between the electrodes, thereby defining different logic levels.

2. A memory cell according to claim 1, characterized in that said dielectric layer is comprised in the gate region of a MOS transistor.

3. A memory cell according to claim 2, characterized in that the threshold voltage of said MOS transistor depends on the position occupied by said charge within said dielectric layer.

4. A memory cell according to claim 3, characterized in that said gate region envelops said layer in a cage of insulating material.

5. A memory cell according to claim 4, characterized in that said semi-insulating material and said insulating cage are the insulating layer of said MOS transistor.

6. A memory cell according to claim 1, characterized in that the semi-insulating material is a layer of a mixture of a semiconductor material and oxygen.

7. A memory cell according to claim 1, wherein said layer of semi-insulating material includes plural films of a semiconductor material interspersed with plural films of an oxide material.

8. A memory cell according to claim 1, characterized in that said semi-insulating material comprises a stack of ultra-thin semiconductor material films and an oxide of the same semiconductor material.

9. A memory cell according to claims 6–8, characterized in that said semiconductor material is silicon.

10. A memory cell according to claim 8, characterized in that said oxide of said semiconductor material is silicon oxide.

11. A memory cell according to claim 1, characterized in that said cell is a capacitor-less DRAM.

12. A memory cell according to claim 11, characterized in that said DRAM has a long refresh time.

13. A memory cell according to claim 1, characterised in that said layer of semi-insulating material is the floating gate of an EEPROM.

14. A memory cell according to claim 1, wherein the layer of semi-insulating material includes a silicon-rich oxide layer.

15. A memory cell according to claim 1, wherein the layer of semi-insulating material includes a silicon oxide layer with crystalline silicon grains fully embedded in the silicon oxide.

16. A memory cell, comprising:
a semiconductor substrate;
a first insulating layer positioned on the substrate;
a second insulating layer positioned on the first insulating layer;
an electrode positioned on the second insulating layer;
a layer of a semi-insulating material positioned between the first and second insulating layers, wherein an electric charge is accumulated more closely to the first insulating layer when the memory cell defines a first logic level and the electric charge is accumulated more closely to the second insulating layer when the memory cell defines a second logic level.

17. The memory cell of claim 16, wherein the layer of semi-insulating material includes plural films of a semiconductor material interspersed with plural films of an insulating material.

18. The memory cell of claim 17, wherein the insulating material of the films of insulating material is an oxide of the semiconductor material of the plural films of semiconductor material.

19. The memory cell of claim 17, wherein the semiconductor material is silicon.

20. The memory cell of claim 16, wherein the layer of semi-insulating material includes a silicon-rich oxide layer.

21. The memory cell of claim 16, wherein the layer of semi-insulating material includes a silicon oxide layer with crystalline silicon grains fully embedded in the silicon oxide.

22. A memory cell, comprising:
a semiconductor substrate;
a first insulating layer positioned on the substrate;
a second insulating layer positioned on the first insulating layer;
an electrode positioned on the second insulating layer;
a layer of silicon-rich oxide positioned between the first and second insulating layers.

* * * * *